United States Patent [19]
Matsuda et al.

[11] Patent Number: 5,136,543
[45] Date of Patent: Aug. 4, 1992

[54] DATA DESCRAMBLING IN SEMICONDUCTOR MEMORY DEVICE

[75] Inventors: Yoshio Matsuda; Kazuyasu Fujishima; Kazutami Arimoto; Masaki Tsukude; Tsukasa Oishi, all of Hyogo, Japan

[73] Assignee: Mitsubishi Denki Kabushiki Kaisha, Toyko, Japan

[21] Appl. No.: 741,208

[22] Filed: Jul. 31, 1991

Related U.S. Application Data

[63] Continuation of Ser. No. 520,179, May 8, 1990, abandoned.

[30] Foreign Application Priority Data

May 12, 1989 [JP] Japan ................. 1-119211

[51] Int. Cl.$^5$ .................... G11C 5/06; G11C 7/00
[52] U.S. Cl. ..................... 365/190; 365/51; 365/201
[58] Field of Search ............. 365/51, 63, 190, 200, 365/201

[56] References Cited

U.S. PATENT DOCUMENTS 4,866,676  9/1989  Crisp et al. ............. 365/201
4,916,661  4/1990  Nawatti et al. ........... 365/190

FOREIGN PATENT DOCUMENTS 61-160900  12/1984  Japan .
63-183690  1/1987  Japan .

OTHER PUBLICATIONS

Kanz et al., "A 256K DRAM with Descrambled Redundancy Test Capability", 1984 IEEE International Solid-State Circuits Conference, Feb. 24, 1984, pp. 272-273, 352.
Yoshihara et al., "A Twisted Bit Line Technique for Multi-Mb DRAMs", 1988 IEEE International Solid-State Circuits Conference, Feb. 19, 1988, pp. 238-239.

Primary Examiner—Joseph A. Popek
Assistant Examiner—Jack A. Lane
Attorney, Agent, or Firm—Lowe, Price, LeBlanc & Becker

[57] ABSTRACT

A semiconductor memory device comprises a plurality of bit line pairs and an input/output line pair. Each bit line pair comprises first and second bit lines supplied with complementary data, and the input/output line pair comprises first and second input/output lines supplied with complementary data. A switching circuit is provided on each bit line pair. Each switching circuit, in response to a control signal according to an address signal, respectively couples the first and the second bit lines to the first and the second input/output lines, or inversely, respectively couples the first and the second bit lines to the second and the first input/output lines.

13 Claims, 20 Drawing Sheets

FIG.5

| BLOCK | X1 | X2 | X3 | X4 | φ1 | φ2 | φ3 | φ4 | A TYPE BIT LINE | B TYPE BIT LINE |
|---|---|---|---|---|---|---|---|---|---|---|
| a | 1 | 0 | 0 | 0 | 0 | 1 | 0 | 1 | BL → I/O, $\overline{BL}$ → $\overline{I/O}$ | BL → I/O, $\overline{BL}$ → $\overline{I/O}$ |
| b | 0 | 1 | 0 | 0 | 1 | 0 | 0 | 1 | BL → I/O, $\overline{BL}$ → $\overline{I/O}$ | BL → I/O, $\overline{BL}$ → $\overline{I/O}$ |
| c | 0 | 0 | 1 | 0 | 1 | 0 | 1 | 0 | BL ✕ $\overline{BL}$ I/O $\overline{I/O}$ | BL ✕ $\overline{BL}$ I/O $\overline{I/O}$ |
| d | 0 | 0 | 0 | 1 | 0 | 1 | 1 | 0 | BL → I/O, $\overline{BL}$ → $\overline{I/O}$ | BL ✕ $\overline{BL}$ I/O $\overline{I/O}$ |

FIG.11

| BLOCK | X1 | X2 | X3 | X4 | TYPE | Y1 | $\overline{Y_1}$ | φ5 | φ6 | DATA |
|---|---|---|---|---|---|---|---|---|---|---|
| a | 1 | 0 | 0 | 0 | A | 1 | 0 | 0 | 1 | WD → I/O / $\overline{WD}$ → $\overline{I/O}$ |
| a | 1 | 0 | 0 | 0 | B | 0 | 1 | 0 | 1 | WD → I/O / $\overline{WD}$ → $\overline{I/O}$ |
| b | 0 | 1 | 0 | 0 | A | 1 | 0 | 1 | 0 | WD → I/O / $\overline{WD}$ → $\overline{I/O}$ |
| b | 0 | 1 | 0 | 0 | B | 0 | 1 | 0 | 1 | WD × I/O / $\overline{WD}$ × $\overline{I/O}$ |
| c | 0 | 0 | 1 | 0 | A | 1 | 0 | 1 | 0 | WD → I/O / $\overline{WD}$ → $\overline{I/O}$ |
| c | 0 | 0 | 1 | 0 | B | 0 | 1 | 1 | 0 | WD × I/O / $\overline{WD}$ × $\overline{I/O}$ |
| d | 0 | 0 | 0 | 1 | A | 1 | 0 | 0 | 1 | WD × I/O / $\overline{WD}$ × $\overline{I/O}$ |
| d | 0 | 0 | 0 | 1 | B | 0 | 1 | 1 | 0 | WD × I/O / $\overline{WD}$ × $\overline{I/O}$ |

DATA DESCRAMBLING IN SEMICONDUCTOR MEMORY DEVICE

This application is a continuation of application Ser. No. 07/520,179 filed May 8, 1990 now abandoned.

BACKGROUND OF THE INVENTION

1. Field of the Invention

The present invention relates to generally semiconductor memory devices and a method of operating thereof, more particularly, to a semiconductor memory device in which a physical arrangement of data stored in memory cells in a chip can be adjusted and to a method of adjusting physical arrangements of stored data.

2. Description of the Background Art

FIG. 16 is a diagram showing a conventional semiconductor memory device having a folded bit line structure. In FIG. 16, a plurality of word lines WL1 and WL2 are disposed so as to intersect with a plurality of bit line pairs BL and $\overline{BL}$. Memory cells MC are provided at intersections of bit lines BL and word lines WL1, and at intersections of bit lines $\overline{BL}$ and word lines WL2. A plurality of word lines WL1 and WL2 are connected to a row decoder 3. A sense amplifier 40 is connected between each bit line pair BL and $\overline{BL}$. Each bit line pair BL and $\overline{BL}$ is connected to an input/output line pair I/O and $\overline{I}$/ through transistors 5a and 5b. The transistors 5a and 5b are controlled by outputs of a column decoder 6.

Operation of the semiconductor memory device in FIG. 16 will be described. In reading operation, the row decoder 3 selects one of a plurality of word lines WL1 and WL2 to raise its potential. As a result, charge stored in memory cells MC connected to the selected word line is read out onto a corresponding bit line BL or $\overline{BL}$. Subsequently, the sense amplifiers 40 are activated so that small potential differences between lines BL and $\overline{BL}$ are sensed and amplified. Then, the column decoder 6 selects one of transistor pairs 5a and 5b to render conductive, so that the corresponding bit line pair BL and $\overline{BL}$ is connected to an input/output line pair $\overline{I}$/. In reading operation, the input/output line pair I/O and $\overline{I}$/ is connected to a read data line pair 9a and 9b through a switch S. As a result, complementary data RD and $\overline{RD}$ read out onto the input/output line pair I/O and $\overline{I}$/ from the bit line pair BL and $\overline{BL}$ and is outputted to the external through the read data line pair 9a and 9b and an output buffer (not shown).

In writing operation, at an input buffer (not shown), complementary data WD and $\overline{WD}$ is generated from data inputted from the external. In writing, a write data line pair 10a and 10b is connected to the input/output line pair I/O and $\overline{I}$/ through the switch S, so that the complementary data WD and $\overline{WD}$ is applied to the input/output line pair I/O and $\overline{I}$/ through the write data line pair 10a and 10b. Data on the input/output line pair I/O and $\overline{I}$/ is written in a memory cell MC selected in the same manner as that in reading operation.

If data applied from the external is at the logical high level "H", the data WD attains "H" level, and the data $\overline{WD}$ attains "L" level, so that the data of "H" level is transmitted to the bit line BL, and the data of "L" level to the bit line $\overline{BL}$, through the input/output lines I/O and $\overline{I}$/, respectively. Accordingly, when a memory cell MC connected to the bit line BL is selected, data of "H" level is written into the selected memory cell MC.

When a memory cell MC connected to the bit line $\overline{BL}$ is selected, data of "L" level is written into the selected memory cell MC even if the data applied from the external is of "H" level.

Since the semiconductor memory device is constructed as the above, even if data all of which is of "H" level is written from the external, in practice, data of "H" level and "L" level are written into a plurality of memory cells MC as shown in FIG. 17. In FIG. 17, data of "L" level is written into memory cells MC shown with hatching lines and data of 637 H" level is written into the rest of the memory cells MC.

On the other hand, in "ISSCC Digest Technical Papers", pp. 238-239, a twisted bit line is proposed as a bit line structure whereby a dynamic RAM having less noise caused by capacitance between bit lines and enough margin can be implemented. FIG. 18 shows a schematic diagram of a semiconductor memory device having the twisted bit line structure. FIG. 18 corresponds to FIG. 16, and the portions given the same reference characters as those of FIG. 16 denote the corresponding portions in FIG. 16. In FIG. 18, word lines, memory cells and the like are not illustrated so that FIG. 18 can be seen clearly. FIG. 18 is different from FIG. 16 in that bit line pairs BL and $\overline{BL}$ intersecting each other at points CP1 and CP3, and bit line pairs BL and $\overline{BL}$ intersecting each other at the points CP2 and CP4 are arranged alternately. Usually, respective blocks a, b, c and d divided respectively at points CP1, CP2, and CP3 have the same length.

FIG. 19 shows a state wherein data all of which is of "H" level is written from the external into an array of a twisted bit line structure. In FIG. 19, data of "L" level is written into memory cells MC shown with hatching lines, and data of "H" level is written into the rest of the memory cells MC. Thus, physical arrangement of data practically stored in a plurality of memory cells MC in a chip is referred to as 637 data scramble".

The possibility of the occurrence of an error depends on physical patterns of data stored in a plurality of memory cells. Therefore, in testing, it is necessary to arrange data in the pattern in which an error tends to occur. However, as is apparent from FIG. 19, in respective blocks a, b, c, and d, arrangements of "H" level data in practice stored in the memory cells MC are different. Therefore, it is difficult to arrange data in a desired pattern. As a result, analysis of defects in testing a semiconductor memory device becomes complicated. More specifically, in a memory tester, data to be written in the memory cell should be changed corresponding to addresses such that data patterns stored in respective blocks a, b, c and d are all the same. Accordingly, a memory tester has a great disadvantage in both hardware and software. Some memory testers do not have such a complicated function, wherein the above analysis of defects of a semiconductor memory device can not be made.

Disclosed in the official gazette of Japanese Patent Laying Open No. 61-160900 is a write/read circuit in which polarity of data written and read to and from RAM in test can be converted. This write/read circuit enables adjustment of arrangements of data stored in memory cells in RAM. However, when a test is performed with this write/read circuit, the circuit needs to be that corresponding to the arrangement of the RAM to be tested. More specifically, when a RAM having an other arrangement is tested, it is necessary to modify the logic of the write/read circuit or the circuit needs to be that corresponding to the arrangement of the RAM. Therefore, handling in test is not simple.

SUMMARY OF THE INVENTION

An object of the present invention is to obtain a semiconductor memory device in which physical arrangements of data stored in a plurality of memory cells can be adjusted within a chip.

A further object of the present invention is to obtain an operating method wherein the physical arrangement of data stored in a plurality of memory cells of a semiconductor memory device can be adjusted within a chip.

A further object of the present invention is to obtain a semiconductor memory device in which patterns of data arrangements can be the same in all regions in a memory array.

A further object of the present invention is to adjust physical arrangements of data stored in a semiconductor memory device having twisted bit line structure within the chip.

A further object of the present invention is to facilitate a test of a semiconductor memory device.

A semiconductor memory device according to the present invention is a semiconductor memory device formed on the same chip, comprising a plurality of memory cells, a selecting device, at least one pair of data line pairs, an input/output device, and a path switching device.

A selecting device is responsive to an externally applied address signal for selecting any of a plurality of memory cells. Each data line pair is comprised of first and second data lines for writing and reading of data to or from a memory cell selected by the selecting device. The input/output device has first and second paths for transmitting complementary data, and applies input data applied from the external to the data line pair as complementary data or outputs complementary data applied from the data line pair as output data to the external.

The path switching device is coupled between the data line pair and the input/output device. The path switching device has a function responsive to an address signal for coupling the first and the second paths to the first and the second data lines, respectively, or conversely, the first and the second paths to the second and the first data lines.

In the semiconductor device according to the present invention in writing of data, externally input data is applied to a data line pair as complementary data. Data and complementary data of the first and the second paths are applied to the first and the second data lines respectively, or conversely, applied to the second and the first data lines respectively.

In reading of data, depending on an address, data and complementary data on the data line pair is applied to the first path and the second path, respectively, or conversely, to the second path and the first path, respectively.

In this way, in reading of data, a path through which complementary data passes is switched depending on an address signal. Therefore, physical arrangements of data stored in a plurality of memory cells can be adjusted within a chip. Accordingly, data scramble of a semiconductor memory device can be easily adjusted within the chip.

The semiconductor memory device according to another aspect of the present invention further comprises a setting device for setting the above function of the path switching device abled or disabled, whereby the function can be made disabled when a adjusting data scramble is not necessary to users.

The semiconductor memory device formed on a chip according to another aspect of the present invention comprises a plurality of word lines; a plurality of bit line pairs, the bit lines of each pair of bit lines intersecting each other and having at least one crossover portion; a plurality of memory cells at intersections of said word lines and said bit lines pairs; address decoder means responsive to an externally applied address signal for selecting any of said plurality of memory cells; an I/O line pair for transferring complementary data between said bit line pairs and outside said chip; data path switching means between said I/O signal lines and said plurality of bit line pairs for transferring data between corresponding or complementary lines of said bit line pair and said I/O line pair, selectively; and means responsive to said address decoder means for controlling said data path switching means.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a chart for explaining operation of the switching circuit;

FIG. 11 is a chart for explaining operation of the switching circuit shown in FIG. 9;

DESCRIPTION OF THE PREFERRED EMBODIMENTS

Embodiments of the present invention will be described in detail in reference to the drawings in the following.

Figure 1:
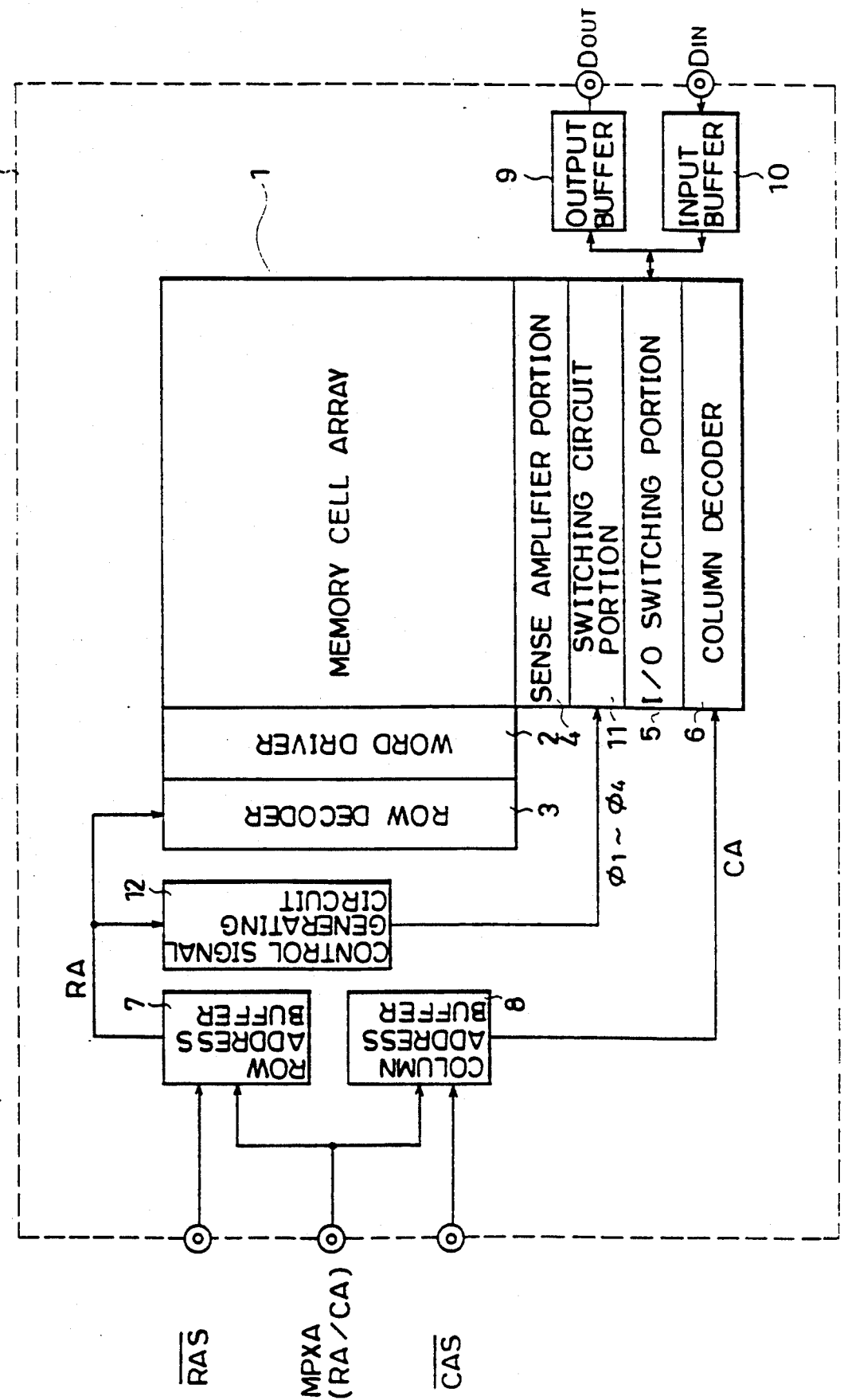
FIG. 1 is block diagram showing an entire structure of a semiconductor memory device according to one embodiment of the present invention.
Figure 2:
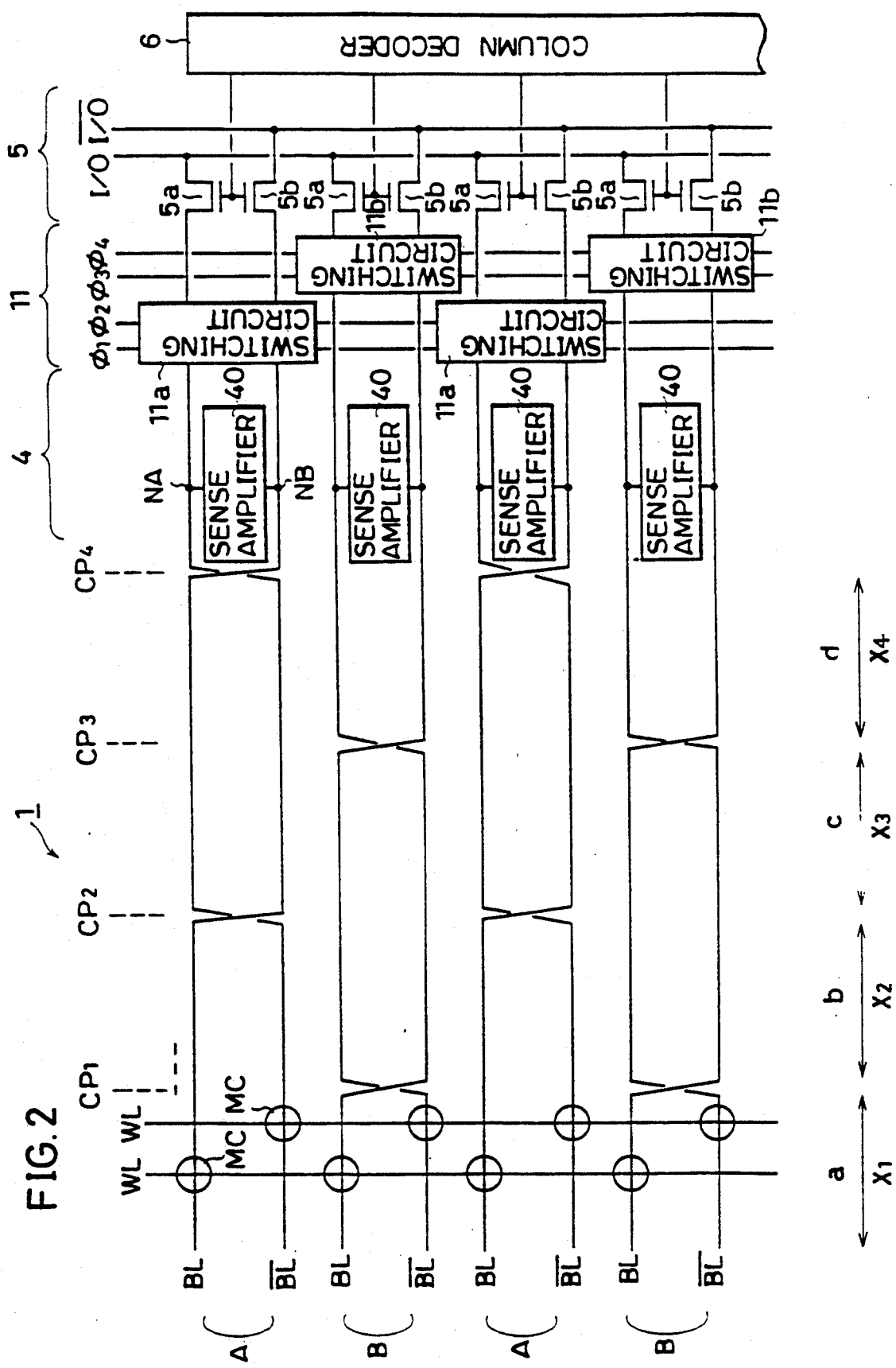
FIG. 2 is a diagram showing a detailed structure of the main part of the semiconductor memory device shown in FIG. 1.

FIG. 1 is a block diagram showing an entire structure of a semiconductor memory device according to one embodiment of the present invention. FIG. 2 is a diagram showing in detail a structure of the main part of the semiconductor memory device shown in FIG. 1.

In a memory cell array 1 shown in FIG. 1, as shown in FIG. 2, a plurality of word lines WL and a plurality of bit line pairs BL and $\overline{BL}$ are disposed so as to intersect each other, and memory cells MC are provided at respective intersections thereof. Word lines WL in the memory cell array 1 are connected to a row decoder 3 through a word driver 2. Bit line pairs BL and $\overline{BL}$ in the memory cell array 1 are connected to a column decoder 6 through a sense amplifier portion 4, a switching circuit portion 11 and an I/O switching portion 5. A multiplexed address signal MPXA of a row address signal RA and a column address signal CA is applied to a row address buffer 7 and a column address buffer 8. The row address buffer 7 applies the address signal MPXA as a row address signal RA to the row decoder 3 in response to a row address strobe signal $\overline{RAS}$ applied from the external. The column address buffer 8 applies the address signal MPXA as a column address signal CA to the column decoder 6 in response to a column address strobe signal $\overline{CAS}$.

A control signal generating circuit 12 generates control signals $\phi 1$-$\phi 4$ for controlling the switching circuit portion 11 in response to a part of the row address signal RA. In writing of data, input data $D_{IN}$ applied from the external is applied to the I/O switching portion 5 through an input buffer 10. In reading of data, data read out into the I/O switching portion 5 is outputted as output data $D_{OUT}$ to the external through an output buffer 9. Respective portions 1-12 of the semiconductor memory device are formed on the same chip 100.

Referring to FIG. 2, in the memory cell array 1, bit line pairs, the bit lines BL and $\overline{BL}$ of each pair intersecting each other at equipartition points CP2 and CP4, and bit line pairs, the bit lines BL and $\overline{BL}$ of each pair intersecting each other at equipartition points CP1 and CP3, are disposed alternately. The bit line pairs BL and $\overline{BL}$ having crossing portions at the equipartition points CP2 and CP4 are referred to as A-type bit line pairs, and the bit line pairs BL and $\overline{Bl}$ having crossing portions at the equipartition points CP1 and CP3 as B-type bit line pairs. Four regions divided at the equipartition points CP1, CP2 and CP3 are referred to as blocks a, b, c and d, respectively. In this semiconductor memory device, by providing crossing portions at a plurality of points of the bit line pair, each capacitive coupling noise which each bit line pair receives from its adjacent bit line pair becomes completely identical, so that reduction of a potential difference on a bit line pair is controlled.

A sense amplifier 40 is connected to each bit line pair BL and $\overline{BL}$. Each bit line pair BL and $\overline{BL}$ is connected to an input/output line pair I/O and $\overline{I}/$ through transistors 5a and 5b. A switching circuit 11a is provided on each bit line pair BL and $\overline{BL}$ of A-type, and a switching circuit 11b is provided on each bit line pair BL and $\overline{Bl}$ of B-type. The switch of circuit 11a, in response to the control signals $\phi 1$ and $\phi 2$ applied from the control signal generating circuit 12 of FIG. 1, respectively connects bit lines BL and $\overline{BL}$ to the input/output lines I/O and $\overline{I}/$, or conversely, to the input/output lines $\overline{I}/$ and I/O. The switching circuit 11b, in response to the control signals $\phi 3$ and $\phi 4$ applied from the control signal generating circuit 12 of FIG. 1, respectively connects bit lines BL and $\overline{BL}$ to the input/output lines I/O and $\overline{I}/$, or conversely, to the input/output lines $\overline{I}/$ and I/O.

Figure 3:
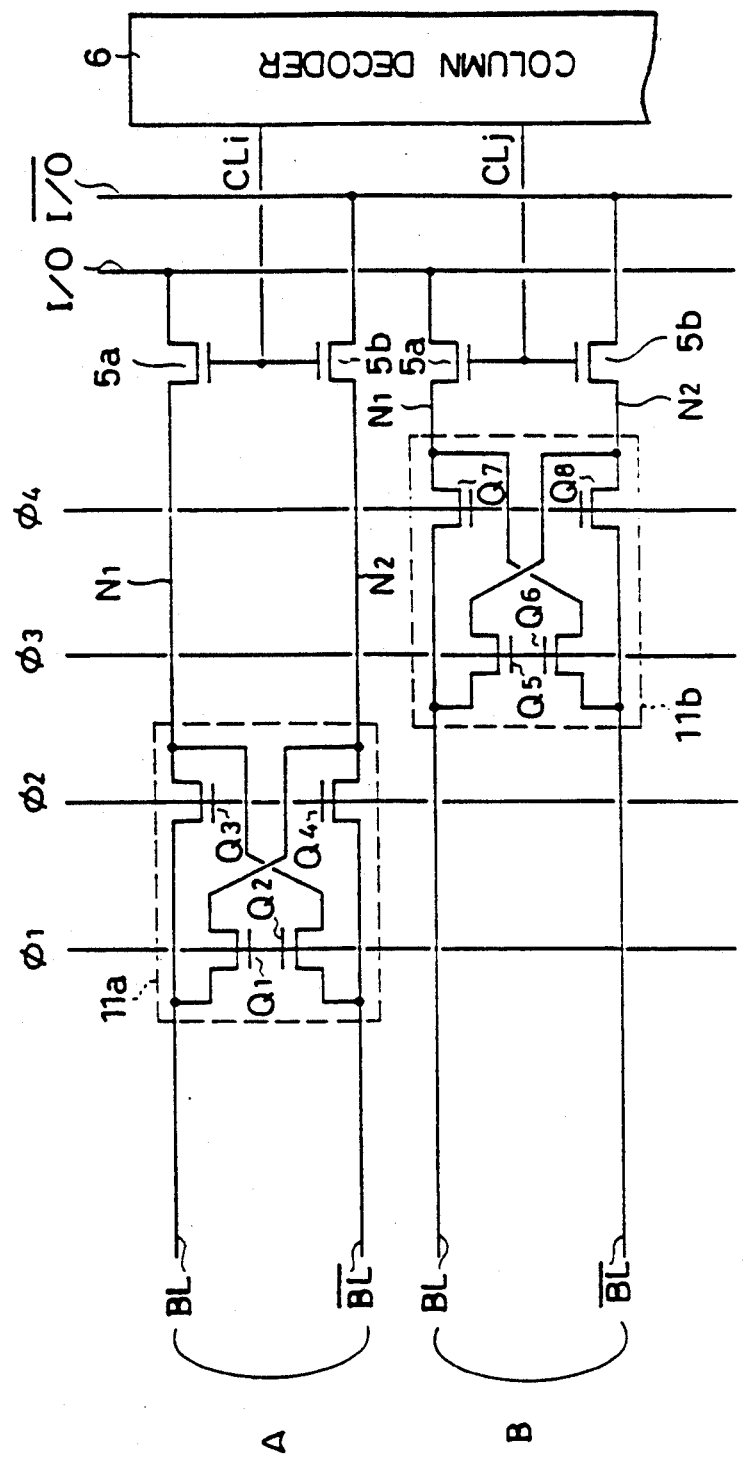
FIG. 3 is a circuit diagram showing a structure of a switching circuit included in the semiconductor memory device shown in FIG. 2.

FIG. 3 shows a detailed circuit diagram of the switching circuits 11a and 11b. The switching circuit 11a comprises transistors Q1-Q4. The transistor Q1 is connected between a bit line BL and a node N2, and the transistor Q2 is connected between a bit line $\overline{BL}$ and a node N1. The transistor Q3 is connected between the bit line BL and the node N1, and the transistor Q4 is connected between the bit line $\overline{BL}$ and the node N2. A control signal $\phi 1$ is applied to gates of the transistors Q1 and Q2, and a control signal $\phi 2$ is applied to gates of the transistors Q3 and Q4. The switching circuit 11b comprises transistors Q5-Q8. The structure of the switching circuit 11b is the same as that of the switching circuit 11a. A control signal $\phi 3$ is applied to gates of the transistors Q5 and Q6, and a control signal $\phi 4$ is applied to gates of the transistors Q7 and Q8.

Figure 4:
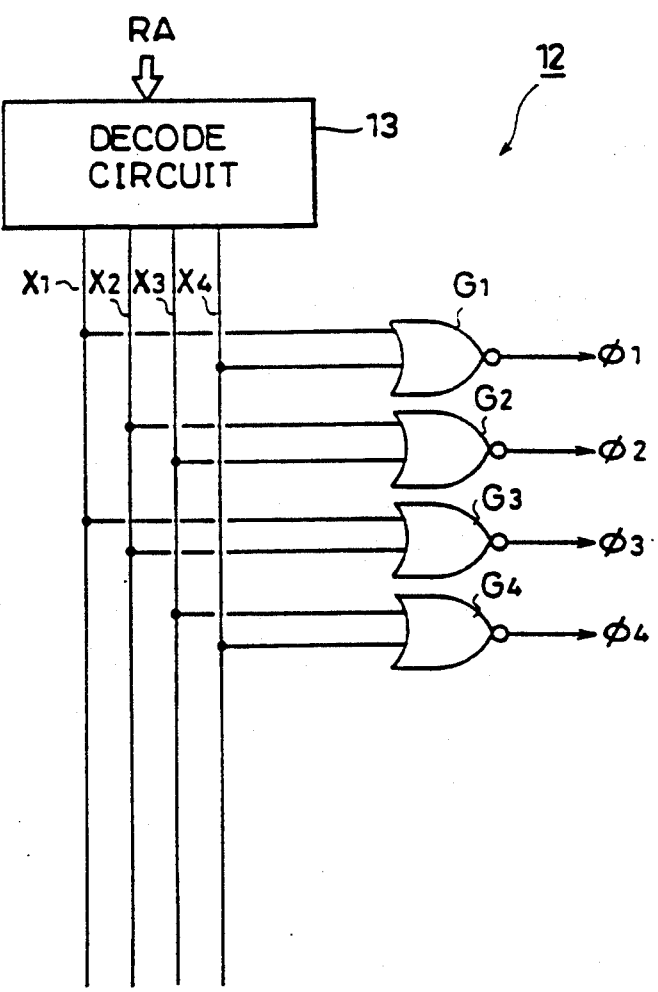
FIG. 4 is a circuit diagram showing a structure of a control signal generating circuit shown in FIG. 1.

FIG. 4 shows a structure of the control signal generating circuit 12. A decoding circuit 13 predecodes two bits of a row address signal RA to generate decoding signals X1-X4. Two of the decoding signals X1-X4 are applied to two input terminals of respective NOR gates G1-G4. Control signals $\phi 1$-$\phi 4$ are outputted from output terminals of the NOR gates G1-G4, respectively. In stand-by, all the decoding signals X1-X4 are at the "L" level. Therefore, all the control signals $\phi 1$-$\phi 4$ are at the "H" level. In writing and reading, not all of the decoding signals X1-X4 attains the "L"0 level, so that some of the control signals $\phi 1$ and $\phi 2$, and of the control signals $\phi 3$ and $\phi 4$ attain the "L" level.

Now, with reference to FIGS. 1 to 4 and FIG. 5, operation will be described wherein data of "H" level is written as input data $D_{IN}$ from the external. When a word line WL in the block a is selected by the row decoder 3, the decoding signal X1 attains the "H" level. Similarly, when a word line WL in the block b, a word line WL in the block c, and a word line WL in the block d are selected, the decoding signals X2, X3 and X4 attain the "H" level, respectively. In FIG. 5, "1" corresponds to the "H" level, and "0" to the "L" level.

(1) Operation When a Word Line in the Block a is Selected

When a word line WL in the block a is selected, the decoding signal X1 attains the "H" level, so that the control signals φ1 and φ3 change from the "H" level to the "L" level, thereby rendering the transistors Q1 and Q2 in the switching circuit 11a and the transistors Q5 and Q6 in the switching circuit 11b to non-conductive. As a result, bit lines BL and $\overline{BL}$ of A-type are respectively connected to the input/output lines I/O and $\overline{I/}$, and bit lines BL and $\overline{BL}$ of B-type are respectively connected to the input/output lines I/O and $\overline{I/}$ (FIG. 3 and FIG. 5). Accordingly, in bit line pairs of A-type and B-type, data of "H" level is written into memory cells MC connected to bit lines BL, and data of "L" level is written into memory cells MC connected to bit lines $\overline{BL}$.

(2) Operation When a Word Line in the Block b is Selected.

When a word line WL in the block b is selected, the decoding signal X2 attains the "H" level, so that the control signals φ2 and φ3 attain the "L" level, thereby rendering the transistors Q3 and Q4 in the switching circuit 11a, and the transistors Q5 and Q6 in the switching circuit 11b to non-conductive. As a result, bit lines BL and $\overline{BL}$ of A-type are respectively connected to the input/output lines $\overline{I/}$ and I/O, and bit lines BL and $\overline{BL}$ of B-type are respectively connected to the input/output lines $\overline{I/}$ and I/O. Accordingly, in bit line pairs of A-type, data of "L" level is written into memory cells MC connected to bit lines BL, and data of "H" level is written into memory cells MC connected to bit lines $\overline{BL}$. In bit line pairs of B-type, data of "H" level is written into memory cells MC connected to bit line BL, and data of "L" level is written into memory cells MC connected to bit lines $\overline{BL}$.

Figure 6:
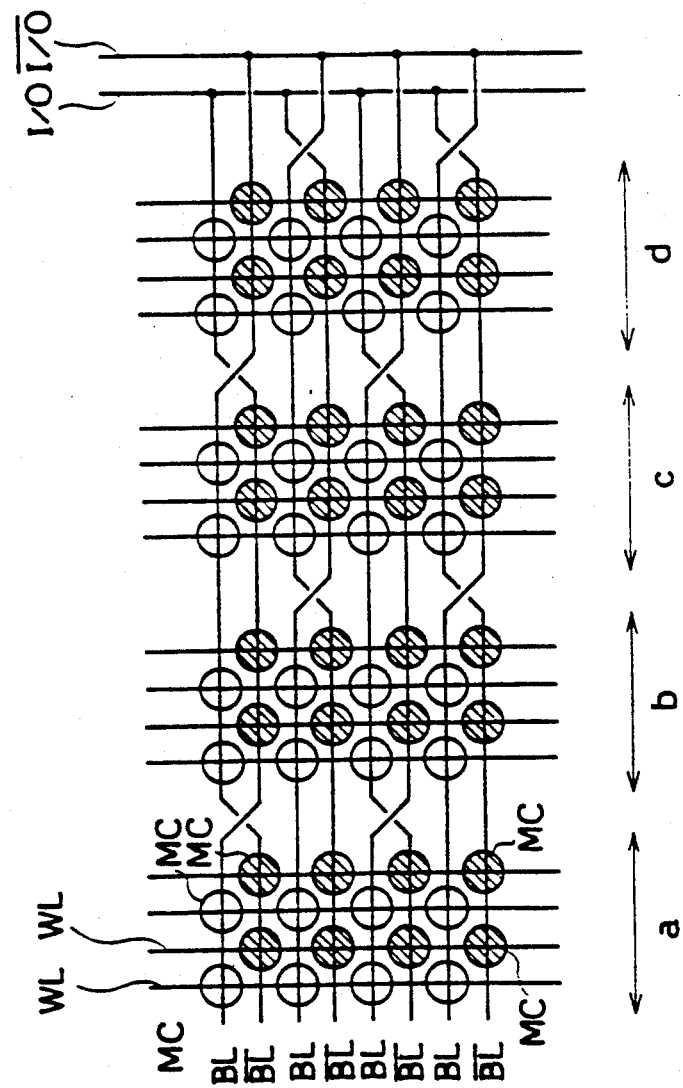
FIG. 6 is a schematic diagram for explaining arrangements of data stored in a plurality of memory cells in the semiconductor memory device shown in FIG. 1.

In FIG. 6, data of "L" level is stored in memory cells MC shown with hatching lines, and data of "H" level is stored in the rest of memory cells MC. As shown in FIG. 6, the arrangement of data stored in the memory cells MC in the block b is completely the same that of data stored in the memory cells MC in the block a.

When a word line in the block c is selected, bit lines BL and $\overline{BL}$ of A-type are respectively connected to the input/output lines $\overline{I/}$ and I/O, and bit lines BL and $\overline{BL}$ of B-type are respectively connected to the input/output lines $\overline{I/}$ and I/O. When a word line in the block d is selected, bit lines BL and $\overline{BL}$ of A-type are respectively connected to the input/output lines I/O and $\overline{I/}$, and bit lines BL and $\overline{BL}$ of B-type are respectively connected to the input/output lines $\overline{I/}$ and I/O. Thus, as shown in FIG. 6, in all of the blocks a-d, the arrangements of data stored in the memory cells MC becomes the same.

The switching circuits 11a and 11b may be provided on the side of bit line pairs BL and $\overline{BL}$ with respect to sense amplifiers 40. In reading, potentials of nodes NA and NB are amplified to the power supply potential $V_{CC}$ and 0V by the sense amplifiers 40. In this case, if switching circuits 11a and 11b are provided between bit line pairs BL and $\overline{BL}$ and sense amplifiers 40, potentials of "H" level decrease from the power supply potential $V_{CC}$ by the amount of a threshold voltage $V_{TH}$ of a transistor in a switching circuit 11a or a switching circuit 11b. Therefore, potentials rewritten into memory cells MC (in refresh operation) become lower than the power supply potential $V_{CC}$. In writing, the same occurs. In order to avoid such decrease of potentials, it is necessary to boost the control signals φ1-φ4 to potentials higher than the power supply potential $V_{CC}$, or to provide a P-channel transistor to be paired with an N-channel transistor in a switching circuit 11a or a switching circuit 11b, which is disadvantageous in a layout and a circuit structure. The embodiment shown in FIG. 2 does not have such a problem as the above, and is easy to be controlled, so that it has advantages in a layout and a circuit structure. On the other hand, in reading operation, there is not such a problem because data read out from memory cells are amplified by the sense amplifiers 40 and then are read out onto the input/output line I/O, $\overline{I/}$.

Figure 7:
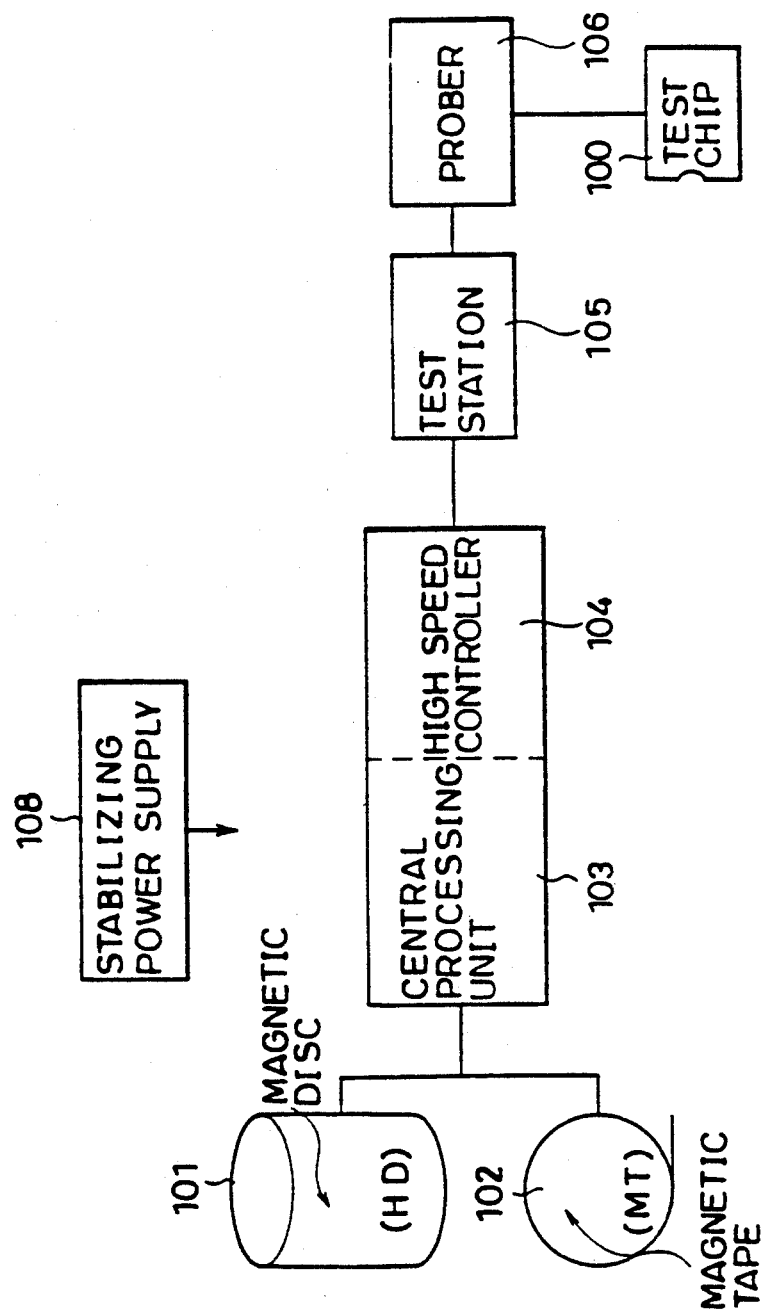
FIG. 7 is a block diagram showing a fundamental structure of a memory tester.

Now, referring to FIG. 7, a memory tester employed in testing a semiconductor memory device will be explained. A system program and a test program stored in a magnetic disc 101 and a magnetic tape 102 are inputted into a main memory in a central processing unit (CPU) 103. The central processing unit 103 controls a high speed controller 104 according to the test program, so that an address signal, data and various control signals are generated from a test pattern generator and a timing generator in the high speed controller 104. These signals are applied in a test chip 100 through a test station 105 and a prober 106. Data read out from the test chip 100 is compared with expected data by a comparator contained in the test station 105. Thus, the test chip 100 is judged either good or not. A power supply of this memory tester is provided from a stabilizing power supply 108.

Figure 8:
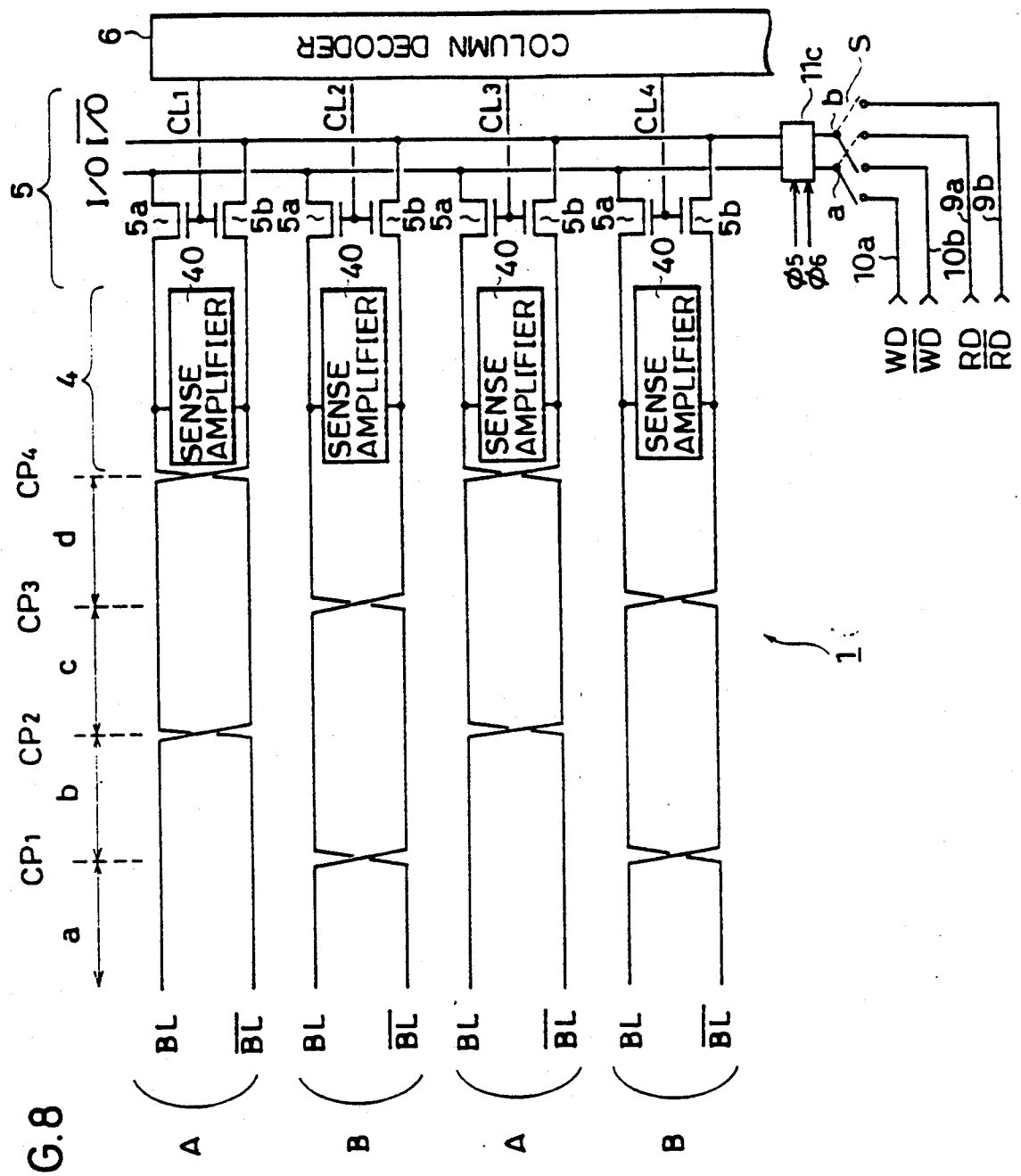
FIG. 8 is a diagram showing a structure of the main part of a semiconductor memory device according to another embodiment of the present invention.
Figure 9:
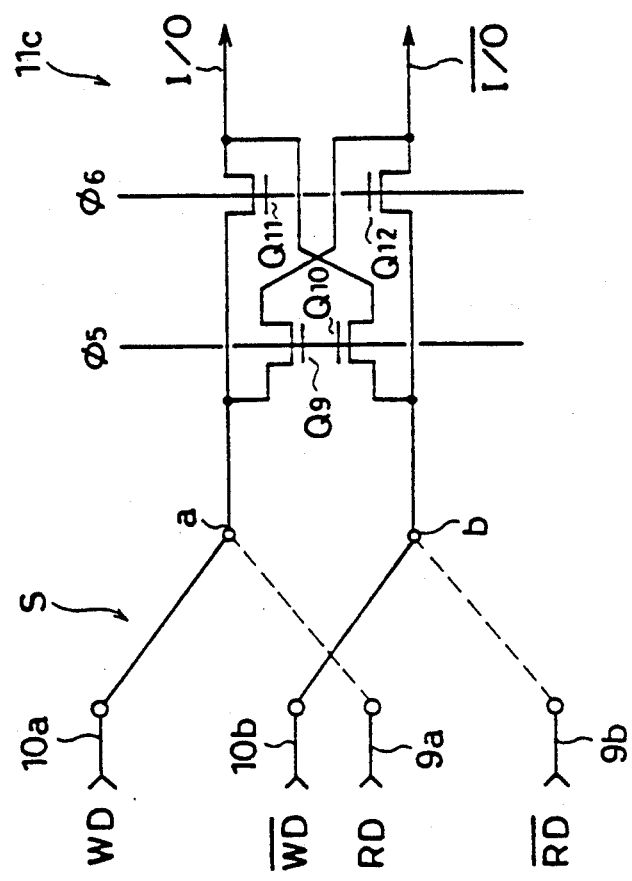
FIG. 9 is a circuit diagram showing a structure of the switching circuit included in the semiconductor memory device shown in FIG. 8.

FIG. 8 is a diagram showing a structure of the main part of a semiconductor memory device according to another embodiment of the present invention. In the embodiment shown in FIG. 8, a switching circuit 11C is provided between the input/output line pair I/O and $\overline{I/}$ and a switch S. As shown in FIG. 9, the switching circuit 11c comprises transistors Q9-Q12. The transistor Q9 is connected between a terminal a of the switch S and the input/output line $\overline{I/}$, and the transistor Q10 is connected between a terminal b of the switch S and the input/output line I/O. The transistor Q11 is connected between the terminal a of the switch S and the input/output line I/O, and the transistor Q12 is connected between the terminal b of the switch S and the input/output line $\overline{I/}$. A control signal φ5 is applied to gates of the transistors Q9 and Q10, and a control signal φ6 is applied to gates of the transistors Q11 and Q12.

Figure 10:
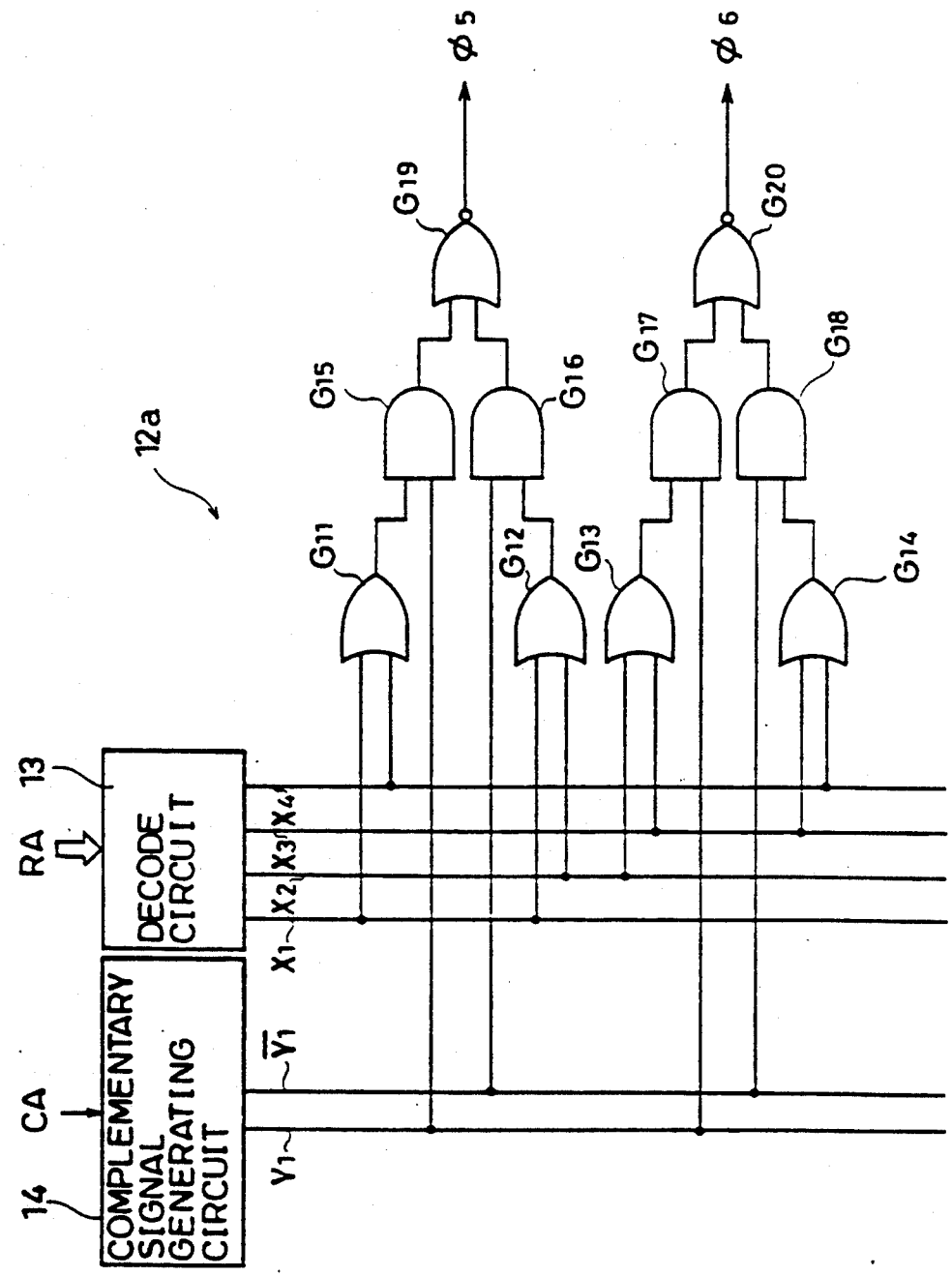
FIG. 10 is a circuit diagram showing a structure of a control signal generating circuit included in the semiconductor memory device according to the embodiment shown in FIG. 8.

The control signals φ5 and φ6 are generated from a control signal generating circuit 12a shown in FIG. 10. The control signal generating circuit 12a comprises a decoding circuit 13, a complementary signal generating circuit 14, OR gates G11-G14, AND gates G15-G18, and NOR gates G19 and G20. The decoding circuit 13 decodes two bits of a row address signal RA to generate decoding signals X1-X4 in the same manner as the decoding circuit 13 shown in FIG. 4. The complementary signal generating circuit 14 receives one bit of a column address signal CA to generate column selecting signals Y1 and $\overline{Y1}$ which are complementary to each other.

As shown in FIG. 11, when any one of the blocks a, b, c and d is selected by the row decoder 3, any one of the decoding signals X1, X2, X3 and X4 attains the "H" level ("1"). In stand-by, the column selecting signals Y1 and $\overline{Y1}$ are at the "L" level. When in writing or in reading, a bit line pair of A-type is selected by the column decoder 6, the column selecting signal Y1 changes to "H" level ("1") When a bit line pair of B-type is selected by the column decoder 6, the column selecting signal $\overline{Y1}$ changes to "H" level ("1"). In this way, either of the control signals φ5 and φ6 outputted from the NOR gates G19 and G20 of the control signal generating circuit 12a attains the "H" level. When the control signal φ6 is at the "H" level, the terminals a and b of the switch S are connected to the input/output lines I/O and Ī/ respectively. When the control signal φ5 is at the "H" level, the terminals a and b of the switch S are connected to the input/output lines Ī/ and I/O, respectively.

Now, referring to FIG. 8 to FIG. 11, operation when a word line in the block b is selected will be described, wherein, it is assumed that all the data written from the external as input data $D_{IN}$ is of the "H" level.

When a word line in the block b is selected by the row decoder 3 (FIG. 1), the decoding signal X2 attains the "H" level. Thereafter, any one of a plurality of bit line pairs BL and $\overline{BL}$ is selected by the column decoder 6. When a bit line pair of A-type is selected, the column selecting signal Y1 attains "H" level. As a result, the control signal φ5 attains the "H" level, and the control signal φ6 attains the "L" level, so that in FIG. 9, the terminal a is connected to the input/output line Ī/ , and the terminal b is connected to the input-output line I/O. Accordingly, data of "H" level is written into a memory cell connected to a bit line $\overline{BL}$, and data of "L" level is written into a memory cell connected to bit line BL.

Also, when a bit line pair of the B-type is selected, the column selecting signal $\overline{Y1}$ changes to the "H" level. As a result, the terminal a is connected to the input/output line I/O, and the terminal b is connected to the input-/output line Ī/ . Accordingly, data of "H" level is written into a memory cell connected to a bit line BL and data of the "L" level is written into a memory cell connected to a bit line $\overline{BL}$.

When any of other blocks a, c, and d is selected, the switching circuit 11c as shown in FIG. 9 is switched in accordance with logic shown in FIG. 11. As a result, as shown in FIG. 6, physical arrangement of data stored in memory cells MC become the same in all of the blocks a, b, c and d. In the embodiment shown in FIG. 8, only one switch circuit is necessary, so that circuit structure is simplified.

Figure 12:
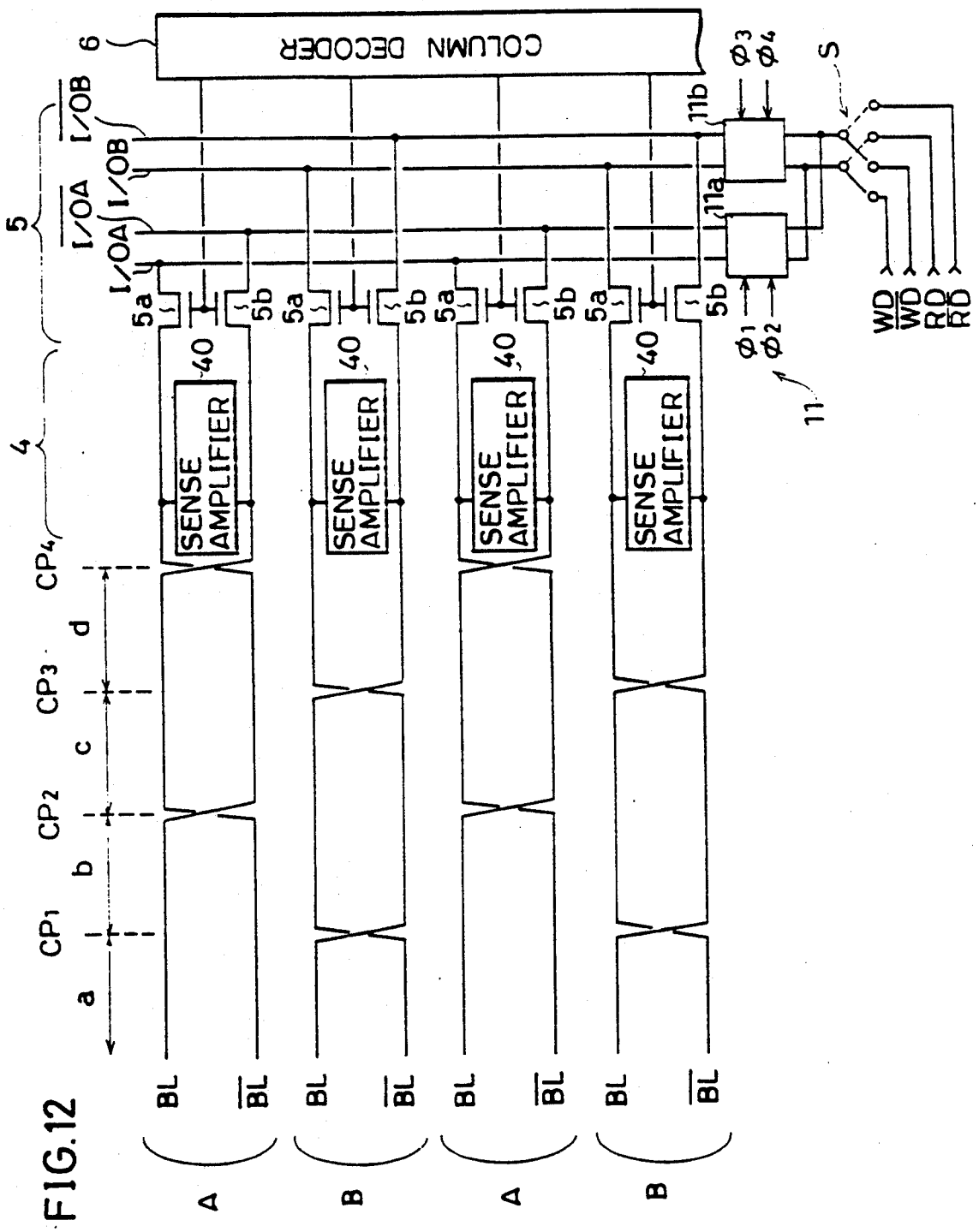
FIG. 12 is a diagram slowing a structure of the main part of the semiconductor memory device according to a further embodiment of the present invention.

FIG. 12 is a diagram showing a structure of the main part of a semiconductor memory device according to a further embodiment of the present invention. In this embodiment, two pairs of input/output line pairs I/OA and ĪA/ , and I/OB and ĪB/ are provided. Bit line pairs BL and $\overline{BL}$ of the A-type are connected to the input-/output line pair I/OA and ĪA/ , and bit line pairs BL and $\overline{BL}$ of the B-type are connected to the input/output line pair I/OB and ĪB/ . A switching circuit 11a is connected to the input/output line pair I/OA and ĪA/ , and a switching circuit 11b is connected to the input-/output line pair I/OB and ĪB/ .

The structure of the switching circuits 11a and 11b is the same as that of the switching circuits 11a and 11b shown in FIG. 3. Control signals φ1–φ4 are generated from the control signal generating circuit 12 shown in FIG. 4. Accordingly, the switching circuits 11a and 11b are operated according to logic shown in FIG. 5.

In this embodiment, when a bit line pair of the A-type is selected by a column decoder 6, data applied from the external is written through the switching circuit 11a and the input/output line pair I/OA and ĪA/ . When a bit line pair of the B-type is selected by the column decoder 6, data applied from the external is written through the switching circuit 11b and the input/output line pair I/OB and ĪB/ . As a result, as shown in FIG. 6, physical arrangement of data stored in memory cells MC becomes identical in all of the blocks a, b, c and d.

In the embodiment shown in FIG. 12, the column address signal CA is not necessary for generating the control signals φ1 and φ2.

Figure 13:
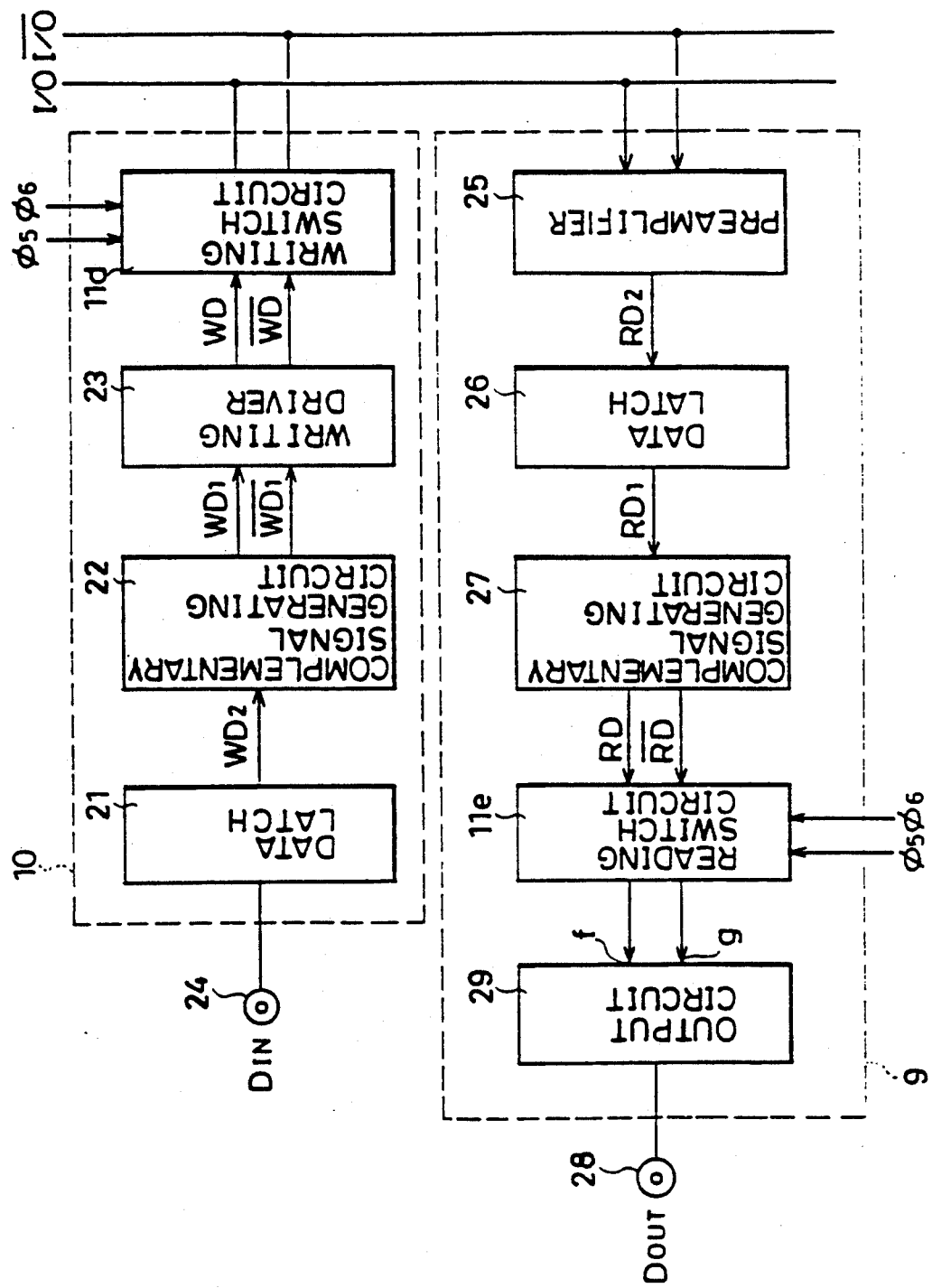
FIG. 13 is a block diagram showing a structure of a part of the semiconductor memory device according to another embodiment of the present invention.

FIG. 13 is a diagram showing structure of the main part of a semiconductor memory device according to still another embodiment of the present invention. In this embodiment, a switching circuit 11d for writing is in an input buffer 10, and a switching circuit 11e for reading is provided in an output buffer 9.

Referring to FIG. 13, the input buffer 10 comprises a data latch 21, a complementary signal generating circuit 22 and a writing driver 23. The switching circuit 11d for writing is connected between the writing driver 23 and the input/output line pair I/O and Ī/ . The data latch 21 latches input data $D_{IN}$ applied from the external in writing to output as input data WD2. The complementary signal generating circuit 22 generates complementary data WD1 and $\overline{WD1}$ from the input data WD2. The writing driver 23 applies the complementary data WD1 and $\overline{WD1}$ as complementary data WD and $\overline{WD}$ to the switching circuit 11d for writing. In response to the control signals φ5 and φ6, the switching circuit 11d for writing applies complementary data WD and $\overline{WD}$ to the input/output lines I/O and Ī/ , respectively, or conversely, to the input/output lines Ī/ and I/O.

The output buffer 9 comprises a preamplifier 25, a data latch 26, a complementary signal generating circuit 27 and an output circuit 29. The switching circuit 11e for reading is connected between the complementary signal generating circuit 27 and the output circuit 29. In reading, the preamplifier 25 amplifies data read out onto the input/output line pair I/O and Ī/ to output as output data RD2. The data latch 26 latches the output data RD2 to output as output data RD1. The complementary signal generating circuit 27 generates complementary data RD and $\overline{RD}$ from the output data RD1. In response to the control signals φ5 and φ6, the switching circuit 11e for reading respectively applies the complementary data RD and $\overline{RD}$ to input terminals f and g of the output circuit 29, or conversely, to input terminals g and f. The output circuit 29 receives the complementary data RD and $\overline{RD}$ to ultimately output output data $D_{OUT}$ of the "H" level or "L" level to the external.

Structures of the switching circuit 11d for writing and the switching circuit 11e for reading are the same as that of the switching circuit 11c shown in FIG. 9. The control signals φ5 and φ6 are generated by the control signal generating circuit 12a shown in FIG. 10. Also in this embodiment, as shown in FIG. 6, physical arrangement of data stored in memory cells MC is identical in all of the blocks a, b, c and d.

In the embodiment shown in FIG. 13, the switching circuit 11d for writing is provided in a stage as late as possible from an input terminal 24 for receiving data $D_{IN}$, whereby data is inputted close to the input/output line pair I/O and Ī/ before the column address is determined, i.e, the column address signal is settled. Therefore, as soon as the column address is determined, the data is written into memory cells. Since in reading, data flows inversely, for the same reason, it is better that the switching circuit 11e for reading is provided close to an output terminal 28. However, in reading, since data is outputted through bit lines BL and $\overline{BL}$, and the input-/output line pair I/O and Ī/ after the column address is determined, the switching circuit 11e for reading does not necessarily need to be disposed close to the output terminal 28.

Figure 14:
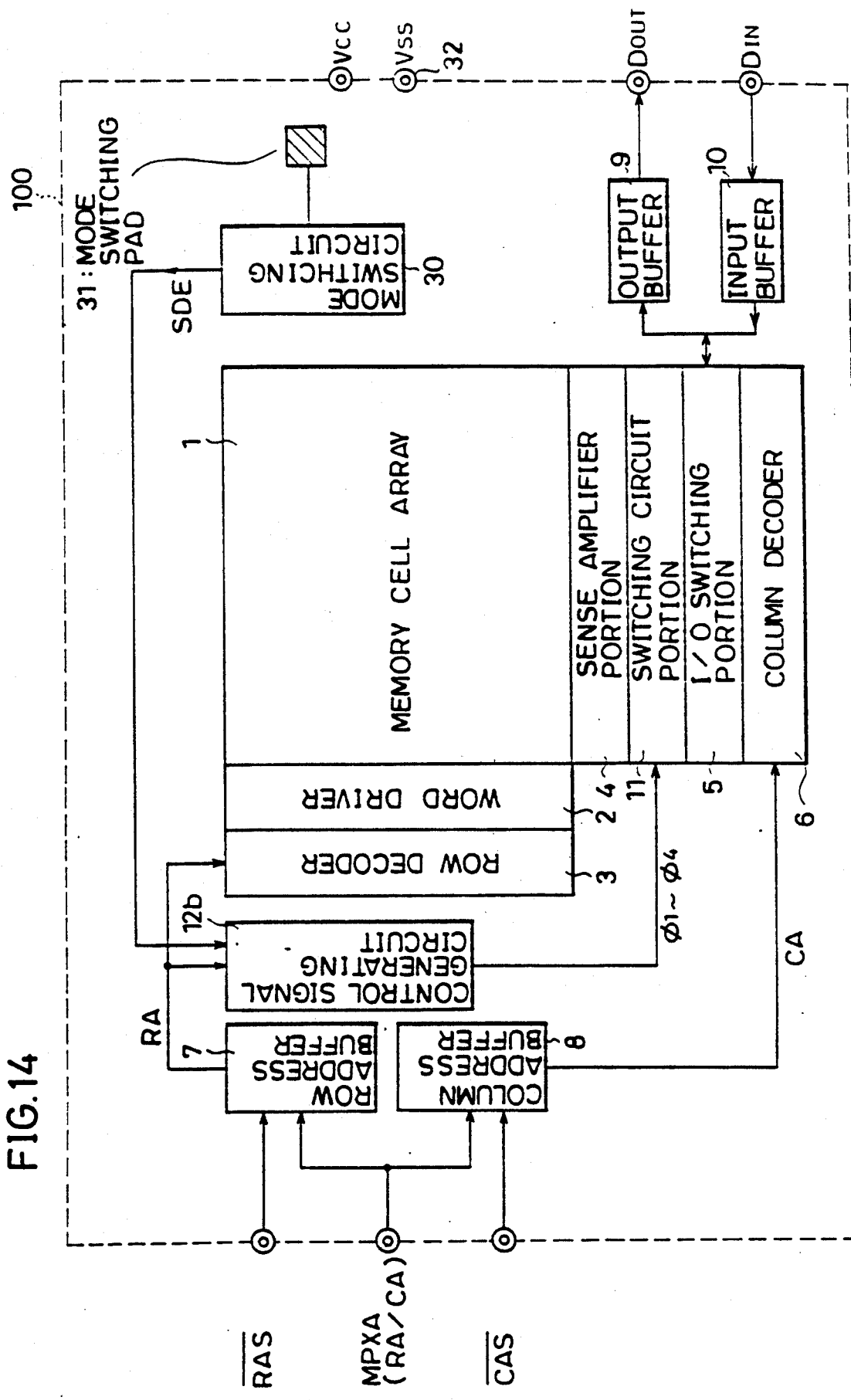
FIG. 14 is a block diagram showing an entire structure of the semiconductor memory device according to another embodiment of the present invention.

FIG. 14 is a block diagram showing a structure of a semiconductor memory device according to a still another embodiment of the present invention. In this embodiment, it is possible to set a function for adjusting data scramble by a switching circuit portion 11 for either effective or ineffective.

Referring to FIG. 14, a pad for switching mode 31 is formed on a chip 100. A mode switching circuit 30 is connected to the switching pad 31. For example, if the mode switching mode pad 31 is connected to a ground terminal 32 for receiving a ground potential $V_{SS}$, the mode switching circuit 30 generates a scramble disable signal SDE of "H" level for setting the data scramble for disabled. When the function for adjusting the data scramble is abled, the scramble disable signal SDE has been at the "L" level. A control signal generating circuit 12b sets the function for adjusting the data scramble for disabled in response to the scramble disable signal SDE of "H" level.

Figure 15:
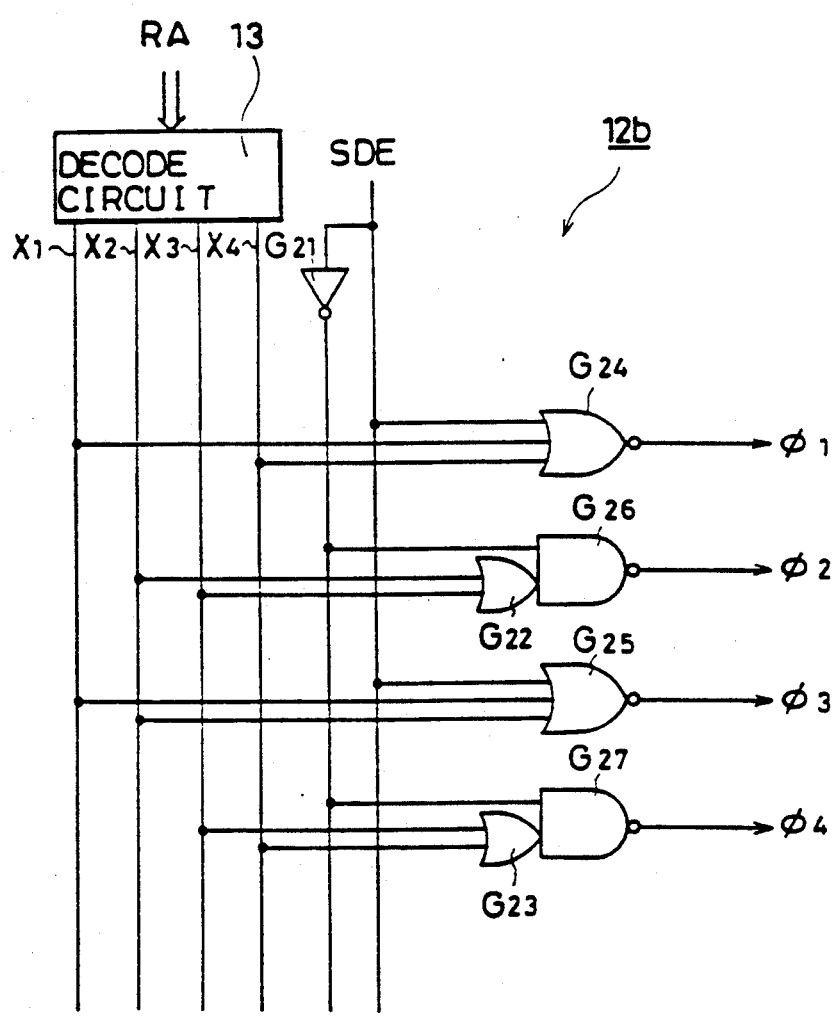
FIG. 15 is a circuit diagram showing a structure of a control signal generating circuit included in the semiconductor memory device shown in FIG. 14.

FIG. 15 shows a detailed circuit structure of the control signal generating circuit 12b. The control signal generating circuit 12b comprises a decoding circuit 13, an inverter G21, OR gates G22 and G23, NOR gates G24 and G25, and NAND gates G26 and G27. When the scramble disable signal SDE is at the "H" level, control signals $\phi 1$ and $\phi 3$ outputted respectively from the NOR gates G24 and G25 are always at the "L" level. At this time, control signals $\phi 2$ and $\phi 4$ outputted respectively from the NAND gates G26 and G27 are always at the "H" level, so that the switching circuits 11a and 11b shown in FIG. 3 always connect bit lines BL and $\overline{BL}$ to the input/output lines I/O and $\overline{I}/$, respectively. That is, the function for adjusting the data scramble by the switching circuits 11a and 11b becomes ineffective.

Although a function for adjusting data scramble is necessary for a manufacturer testing a semiconductor memory device, as in some cases it is not necessary for a user, a function for setting adjustment of such a data scramble ineffective as provided in the embodiment shown in FIG. 4 is useful.

Figure 15A:
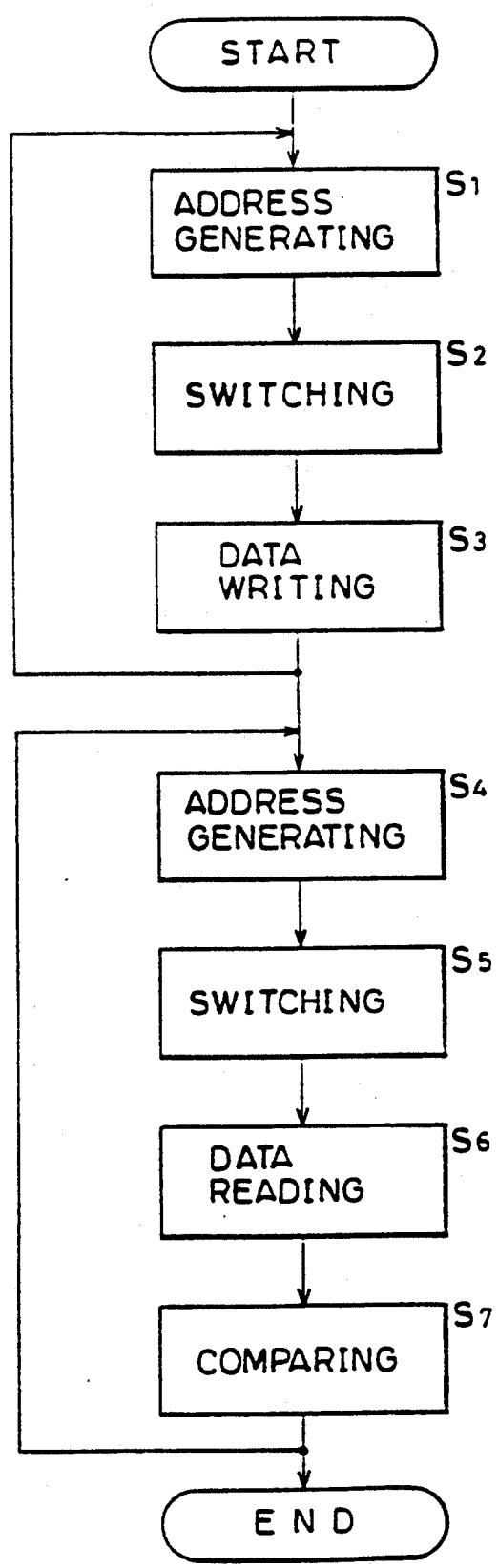
FIG. 15A is a flow chart for explaining testing operation according to the embodiments of the present invention.
Figure 16:
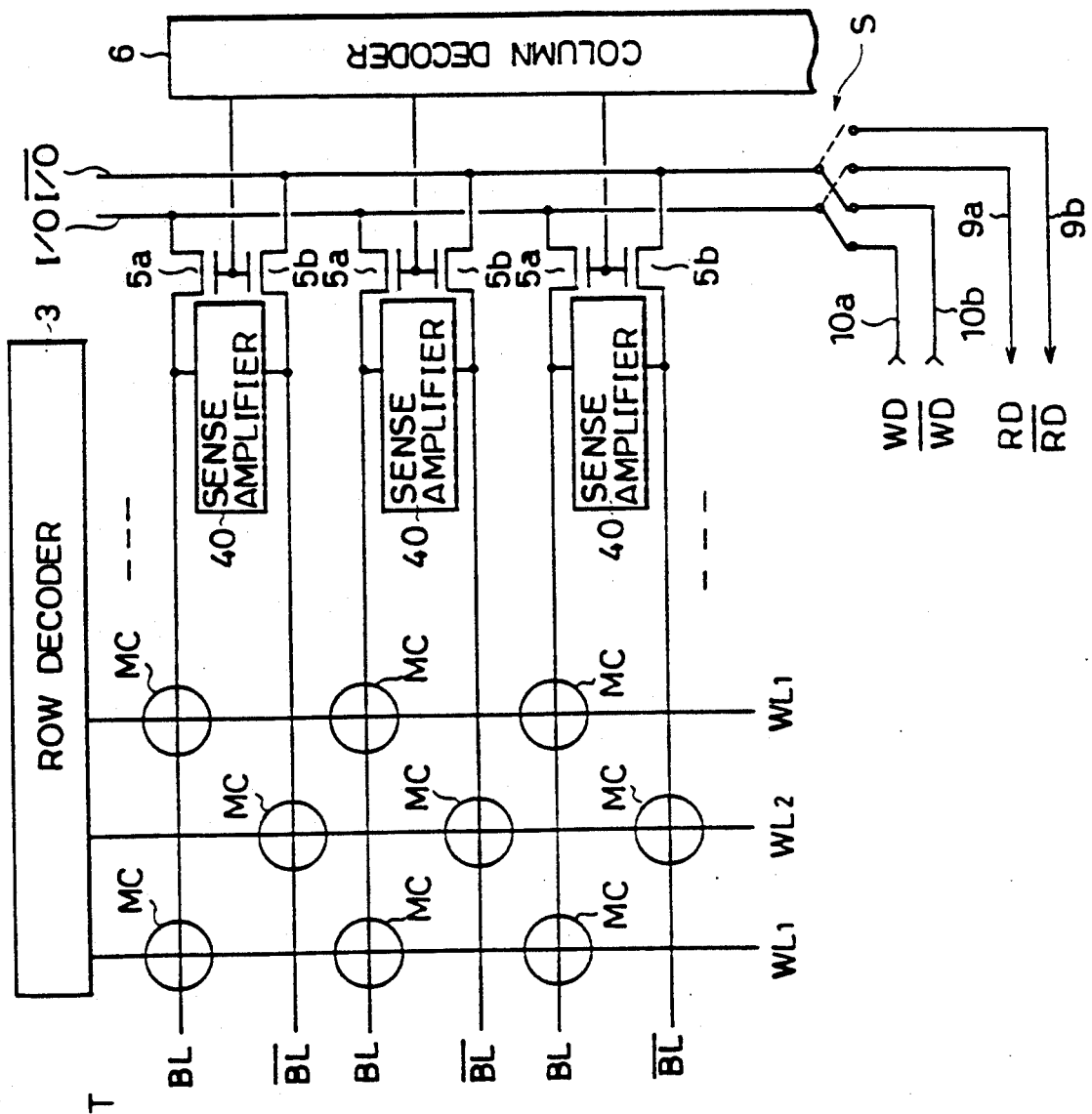
FIG. 16 is a diagram showing a structure of the main part of a conventional semiconductor memory device.
Figure 17:
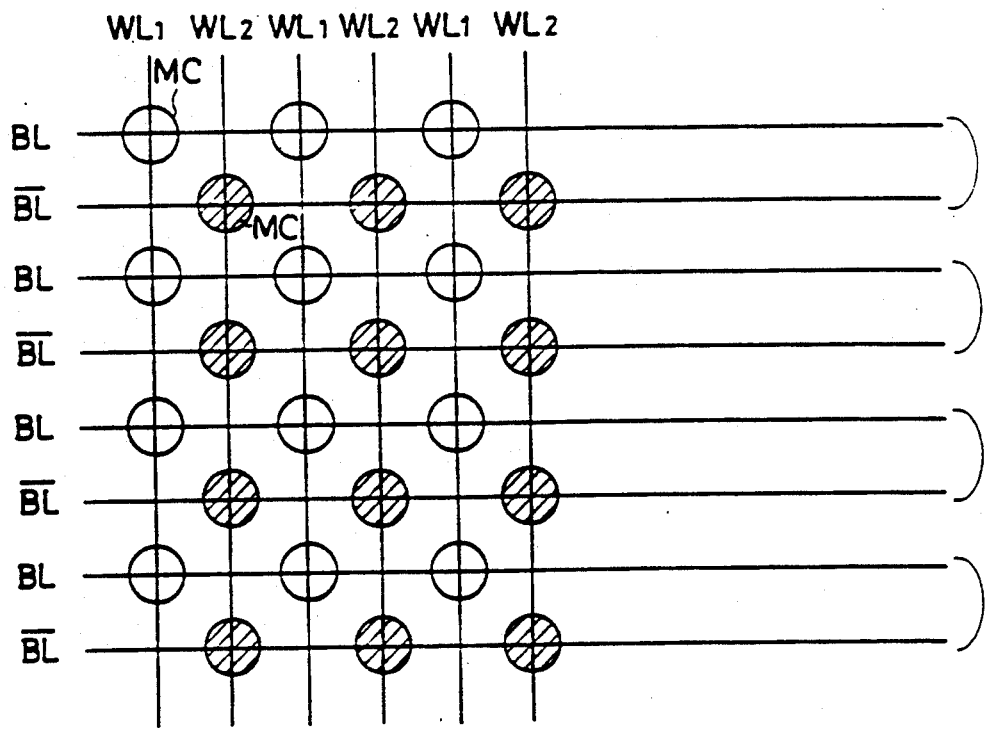
FIG. 17 is a diagram showing arrangements of data stored in a plurality of memory cells in the semiconductor memory device shown in FIG. 16.
Figure 18:
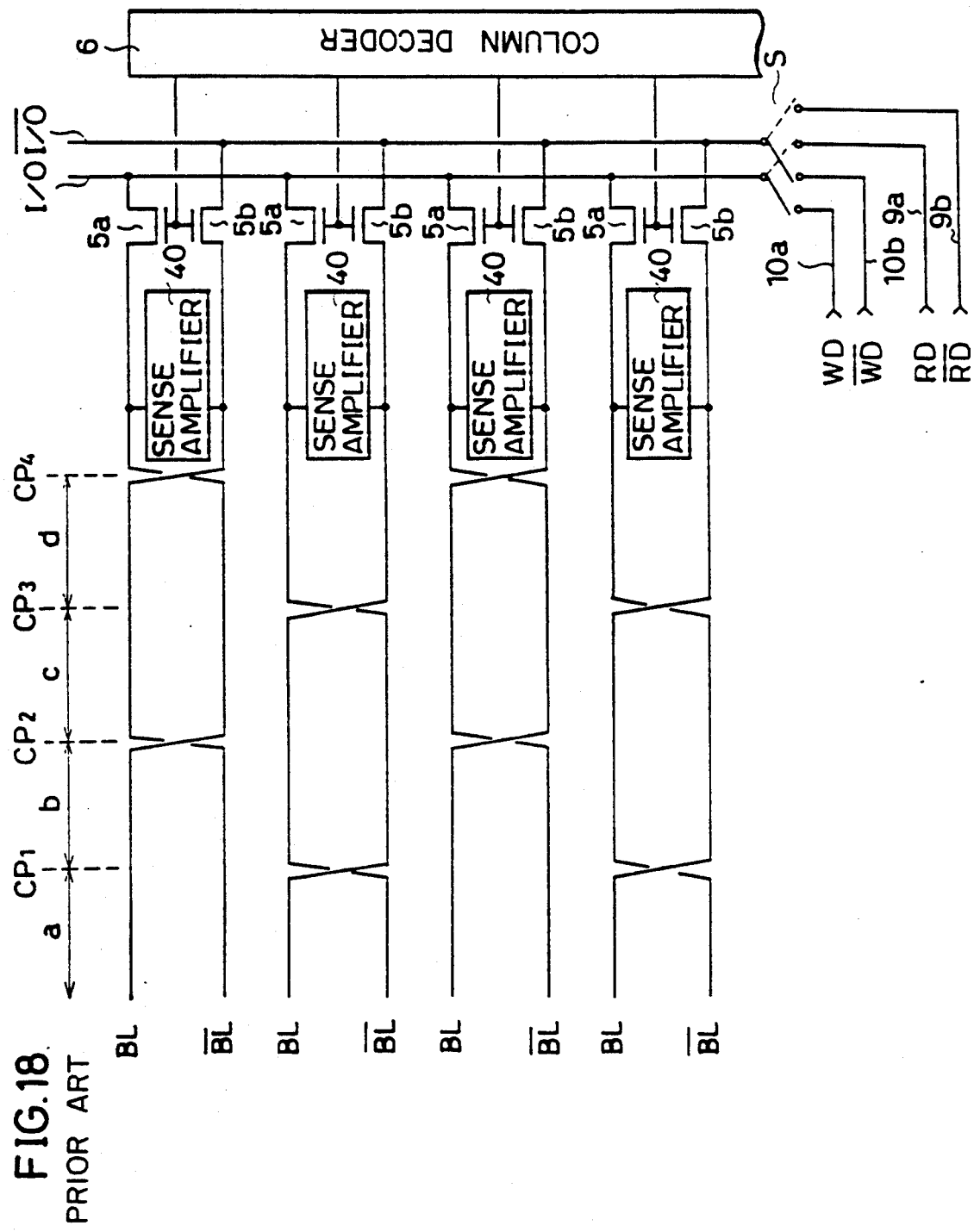
FIG. 18 is a diagram showing a structure of the main part of a conventional semiconductor memory device having a twisted bit line structure.
Figure 19:
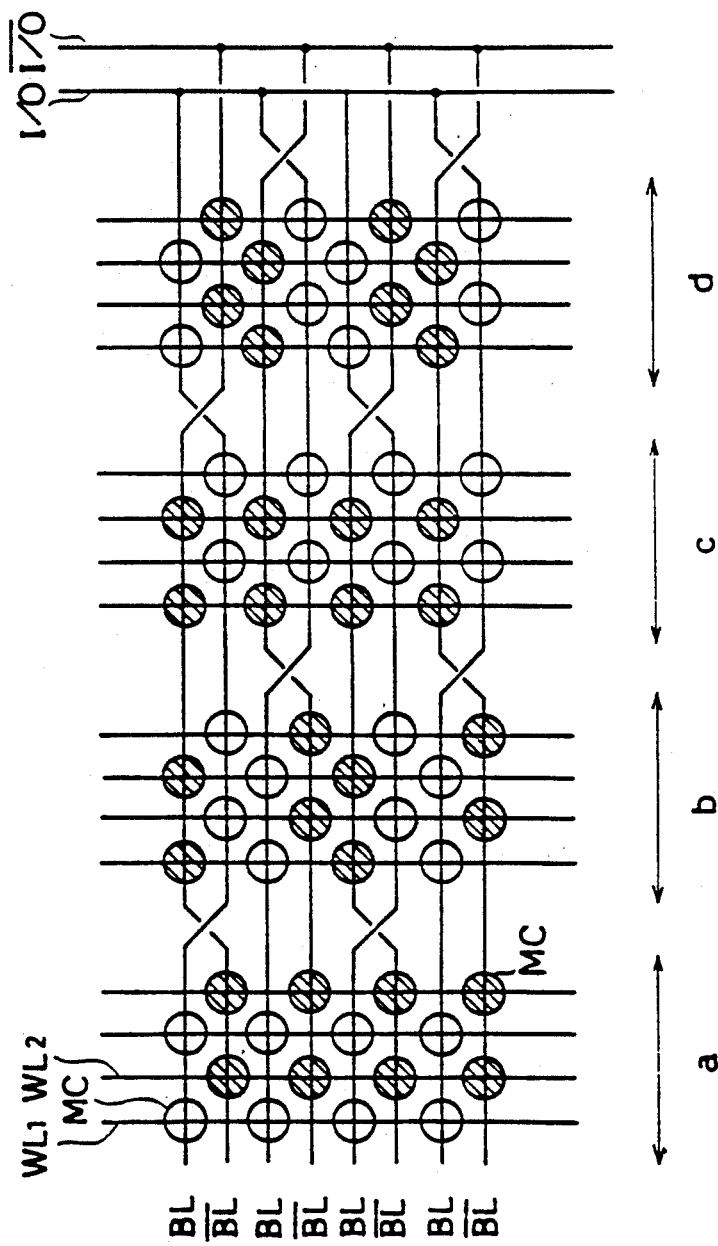
FIG. 19 is a diagram showing arrangements of data stored in a plurality of memory cells in the semiconductor memory device shown in FIG. 18.

Test operation according to the above embodiments will be described briefly in reference to FIG. 15A.

Address signals RA and CA are applied to the semiconductor memory device (Step S1). In response to the address signal RA, the switching circuits 11a and 11b (FIG. 2) are switched (Step S2). Data are written into a memory cell from the input/output lines I/O, $\overline{I}/$ through the switching circuit 11a and 11b in accordance with the address signals RA and CA (Step S3). The operation of the steps S1 to S3 is repeated.

After the writing operation, address signals RA and CA are applied to the semiconductor memory device (Step S4). In response to the address signal RA, the switching circuits 11a and 11b are switched (Step S5). Data are read out from a memory cell to the input/output lines I/O, $\overline{I}/$ through the switching circuit 11a or 11b in accordance with the address signals RA and CA (Step S6). The read data are compared with the expected data which is the same as the previously written data (Step S7). The operation of the steps S4 to S7 is repeated.

Although in the above embodiments, the present invention is applied to a semiconductor memory device having a twisted bit line structure, it is not limited to this but can be applied to a semiconductor memory device having a memory cell array of other structures, for example, a memory device having folded bit-line structure.

As the foregoing, according to the present invention, by means of path switching means for switching a path of complementary data, adjustment can be performed in a chip such that physical arrangements of data stored in a plurality of memory cells become those desired. Therefore, enter in a semiconductor memory device having a complicated array structure, analysis of defects and the like in developing can be easily performed by using a simple memory tester. Accordingly, the cost requiring for a test, and in the long run, the cost of a chip is brought down, so that provision of a semiconductor memory device of a reasonable price becomes possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a single chip, comprising:

a plurality of memory cells arrayed in the form of a matrix of rows and columns, a plurality of bit lines each connected with a column of said plurality of memory cells, said plurality of bit lines arrayed in bit line pairs, a plurality of sense amplifiers, each of said means amplifiers connected to a respective pair of said bit line pairs for detecting and amplifying a potential difference between the bit lines of said respective pair, said bit line pairs formed with crossover points at which bit line locations are interchanged with each other, the rows of memory cells of said matrix thereby divided by said crossover points into row groups, selecting means responsive to an externally applied address signal for selecting any of said plurality of memory cells, input/output means including at least one pair of transmission lines for transmitting information to be written to or read from a bit line pair corresponding to a memory cell selected by said selecting means, and path switching means connected between said sense amplifiers and said input/output means, said path switching means including means for respectively connecting said pair of transmission lines to said sense amplifiers in a first relationship and a second relationship, inverted from said first relationship, in response to identification of one of said row groups by said externally applied address signal.

2. The semiconductor memory device as recited in claim 1, wherein said path switching means comprises:

switching signal generating means responsive to said externally applied address signal for generating a switching signal, and a plurality of switching means corresponding to said plurality of bit line pairs, responsive to said switching signal for respectively coupling a bit line pair corresponding to a selected memory cell to said pair of transmission lines in one of said first and second relationships.

3. The semiconductor memory device according to claim 2, wherein, each bit line pair comprises first and second bit lines, said at least one pair of transmission lines comprises first and second transmission lines, and each of said plurality of switching means comprises:
a first transistor connected between said first bit line and said first transmission line,
a second transistor connected between said second bit line and said second transmission line,
a third transistor connected between said first bit line and said second transmission line, and,
a fourth transistor connected between said second bit line and said first transmission line,
wherein said first and second transistors, or said third and fourth transistors selectively become conductive in response to said switching signal.

4. The semiconductor memory device according to claim 1, further comprising setting means for setting said path switching means in either one of two operating states wherein,
said setting means comprises:
a terminal, and
a mode switching means for generating a disabling signal when a predetermined potential is applied to said terminal,
said path switching means being responsive to said disabling signal for setting one of said two operating states.

5. The semiconductor memory device according to claim 4, wherein said terminal is a pad formed on said semiconductor chip.

6. A method of operating a semiconductor memory device formed on one chip provided with a plurality of memory cells arrayed in the form of a matrix of rows and columns, a plurality of bit lines arrayed in bit line pairs each comprised of first and second bit lines for writing and reading of data to or from any of said plurality of memory cells, said bit line pairs formed with crossover points at which bit line locations of said first and second bit lines are interchanged with each other, the rows of memory cells of said matrix thereby divided by said crossover points into blocks, and input/output means having first and second paths for transmitting data and complementary data, said method comprising the steps of:
selecting any of said plurality of memory cells in response to an externally applied address signal,
selecting one of a first and second relationship in response to the selection of a memory cell in one of said blocks by said externally applied address signal, said first relationship coupling said first and second bit lines to said first and second paths and said second relationship coupling said first and second bit lines to said second and first paths.

7. A semiconductor memory device formed on a chip, comprising:
a plurality of word lines;
a plurality of bit lines arrayed in bit line pairs each comprised of first and second bit lines;
a plurality of memory cells at intersections of said word lines and said bit line pairs, said plurality of memory cells arrayed in the form of a matrix of rows and columns, said bit line pairs formed with crossover points at which bit line locations of said first and second bit lines are interchanged with each other, the rows of memory cells of said matrix thereby divided by said crossover points into blocks;

address decoder means responsive to an externally applied address signal for selecting any of said plurality of memory cells;
an I/O line pair for transferring data and complementary data between said bit line pairs and outside said chip; and
path switching means connected between said I/O line pair and said bit line pairs, said path switching means including means for respectively connecting said data and complementary data between said I/O line pair and said bit line pairs in a first relationship and a second relationship, reverse from that of said first relationship, in response to the selection of a memory cell in one of said blocks by said externally applied address signal.

8. A method of testing a single chip semiconductor memory device comprising a plurality of word lines, a plurality of bit lines arrayed in bit line pairs comprised of first and second bit lines, a plurality of memory cells arrayed in the form of a matrix of rows and columns connected at intersections of said word and bit lines, said bit lines formed with crossover points at which bit line locations of said first and second bit lines are interchanged with each other, the rows of memory cells of said matrix thereby divided by said crossover points into blocks, and an I/O line pair for transferring data and complementary data between said plurality of memory cells and the outside of said chip, the method comprising the steps of:
generating an address signal to successively address said plurality of memory cells;
writing a predetermined test pattern data into said memory cells along a data flow path comprising said I/O line pair and said bit line pairs;
reading contents of said memory cells along a data flow path comprising said I/O line pair and said bit line pairs; and
switching data flow in said data flow path in response to identification of one of said blocks by said address signal, for transferring, selectively, data between bit lines or complementary bit lines of each bit line pair and said I/O line pair so that a switched data flow has a reverse relationship to an unswitched data flow; and
comparing the contents read from said memory cells with said test pattern data.

9. A semiconductor memory device, comprising:
a plurality of memory cells arrayed in the form of a matrix of rows and columns,
a plurality of bit line pairs arranged in columns, each bit line pair connected to memory cells in a corresponding column,
an input/output line pair,
a plurality of transmission gate pairs each connected between a respective bit line pair and said input/output line pair and responsive to a column address, and
a plurality of path switching means each connected between a corresponding bit line pair and a corresponding transmission gate pair and responsive to a control signal for selecting one connection of first and second connections, said first connection comprising connection of a first bit line of a selected bit line pair to a first transmission gate of a corresponding transmission gate pair and connection of a second bit line of said selected bit line pair to a second transmission gate of said corresponding transmission gate pair, said second connection comprising connection of said second bit line of said selected bit line pair to said first transmission gate and connection of said first bit line of said selected bit line pair to said second transmission gate.

10. A semiconductor memory device formed on a single chip, comprising:

a plurality of memory cells arrayed in the form of a matrix of rows and columns;

a plurality of bit lines each connected with a column of said plurality of memory cells, said plurality of bit lines arrayed in bit line pairs, said bit line pairs comprising first and second bit lines respectively connected to memory cells and formed with crossover points at which bit line locations are interchanged with each other, the rows of memory cells of said matrix thereby divided by said crossover points into blocks;

a plurality of sense amplifiers, each of said sense amplifies connected to a respective pair of said bit line pairs for detecting and amplifying a potential difference between the bit lines of said respective pair;

selecting means responsive to an externally applied address signal for selecting any of said plurality of memory cells;

at least one input/output line pair provided corresponding to said row groups, said at least one input/output line pair comprising a first input/output line and a second input/output line, each being selectively coupled to a bit line pair in a corresponding row group;

input/output means, comprising input/output buffer means including a first transmission path and a second transmission path for transmitting information to be written to or read from a bit line pair corresponding to a memory cell selected by said selecting means; and path switching means, comprising switching signal generating means for generating a switching signal in response to the selection of a memory cell in one of said blocks by said externally applied address signal, said path switching means provided between said at least one input/output line pair and said input/output buffer means and responsive to said switching signal for respectively coupling said first and second transmission paths to one of either said first and second input/output lines, and said second and first input/output lines.

11. The semiconductor memory device according to claim 10, wherein, said path switching means includes a first terminal and a second terminal to be coupled to said first and second transmission lines, a first transistor connected between said first input/output line and said first terminal, a second transistor connected between said second input/output line and said second terminal, a third transistor connected between said first input/output line and said second terminal, and, a fourth transistor connected between said second input/output line and said first terminal.

12. A semiconductor memory device formed on a single chip, comprising:

a plurality of memory cells arrayed in the form of a matrix of rows and columns;

a plurality of bit lines each connected with a column of said plurality of memory cells, said plurality of bit lines arrayed in one of first and second bit line pair types, said bit line pair types comprising first and second bit lines respectively connected to memory cells and formed with crossover points at which bit line locations are interchanged with each other, the rows of memory cells of said matrix thereby divided by said crossover points into blocks;

a plurality of sense amplifiers, each of said sense amplifiers connected to a respective pair of said bit line pair types for detecting and amplifying a potential difference between the bit lines of said respective pair;

selecting means responsive to an externally applied address signal for selecting any of said plurality of memory cells;

an input/output line pair provided corresponding to each of said first and second bit line pair types, each input/output line pair comprising a first input/output line and a second input/output line, each said input/output line pair being selectively coupled to a bit line pair type in a corresponding block;

input/output means, comprising:

input buffer means including first and second transmission lines for supplying externally applied data and complementary data to be written to a bit line pair type corresponding to a memory cell selected by said selecting means, and output buffer means including third and fourth transmission lines for receiving data and complementary data to be read from a bit line pair type corresponding to a memory cell selected by said selecting means; and path switching means, comprising:

switching signal generating means for generating a switching signal in response to the selection of a memory cell in one of said blocks by said externally applied address signal, and a plurality of switching means, each switching means corresponding to each of said blocks and provided between each said input/output line pair and said input/output buffer means and responsive to said switching signal for respectively coupling said first and second transmission lines to one of either said first and second input/output lines, and said second and first input/output lines of the corresponding input/output line pair.

13. The semiconductor memory device according to claim 12, wherein, each said path switching means includes a first terminal and a second terminal to be coupled to said first and second transmission lines, a first transistor connected between said first input/output line and said first terminal, a second transistor connected between said second input/output line and said second terminal, a third transistor connected between said first input/output line and said second terminal, and, a fourth transistor connected between said second input/output line and said first terminal.

* * * * *